United States Patent [19]
Nagata

[11] Patent Number: 5,653,638
[45] Date of Patent: Aug. 5, 1997

[54] CARTRIDGE FOR GAME MACHINE

[75] Inventor: Hideo Nagata, Kyoto, Japan

[73] Assignee: Nintendo Co., Ltd., Kyoto, Japan

[21] Appl. No.: 520,925

[22] Filed: Aug. 30, 1995

[30] Foreign Application Priority Data

Aug. 31, 1994 [JP] Japan ................... 6-232249

[51] Int. Cl.$^6$ ...................................... A63F 9/24
[52] U.S. Cl. ........................................ 463/44
[58] Field of Search ................ 463/44, 45; 273/435,
273/148 B; 439/76.1, 76.2, 957, 945, 677,
654; 364/410

[56] References Cited

U.S. PATENT DOCUMENTS

| | | |
|---|---|---|
| 3,083,351 | 3/1963 | Nielson, Jr. . |
| 4,149,027 | 4/1979 | Aihu et al. ................... 463/44 |
| 4,480,835 | 11/1984 | Willianu ................. 439/76.1 X |
| 4,579,338 | 4/1986 | Heffion ..................... 463/44 X |
| 4,596,390 | 6/1986 | Hudley ..................... 463/44 X |
| 4,865,321 | 9/1989 | Nakagawa et al. ........... 463/44 X |
| 5,155,663 | 10/1992 | Harase ..................... 439/945 X |
| 5,184,282 | 2/1993 | Kaneda et al. .............. 439/945 X |
| 5,282,621 | 2/1994 | Tsing ......................... 463/45 |

FOREIGN PATENT DOCUMENTS 0 552 042 A1  1/1993  European Pat. Off. .

OTHER PUBLICATIONS

IBM Technical Disclosure Bulletin, vol. 34, No. 8, Jan. 1992, pp. 152–155 "Circular Area Array Contact".

Primary Examiner—Raleigh W. Chiu
Assistant Examiner—Michael O'Neill
Attorney, Agent, or Firm—Nixon & Vanderhye

[57] ABSTRACT

A cartridge for game machine includes a flat housing (11) consisting of a front half (11F) and a rear half (11R), a board (30) contained in the housing, and a female connector(20) to be connected to a male connector having a plurality of terminal pins. A circuit pattern is formed on the board, and part of the conductive circuit pattern is drawn out to the end of the board so as to form distribution electrodes (32, 32F, 32R). A plurality of terminal holes (21) are formed in corresponding to the plurality of terminal pins, and a plurality of connection terminals (22F, 22R) electrically connected with the distribution electrodes are fitted in the terminal holes, whereby the terminal pins are connected to the distribution electrodes through the connection terminals.

9 Claims, 6 Drawing Sheets

CARTRIDGE FOR GAME MACHINE

BACKGROUND OF THE INVENTION

1. Field of the Invention

The present invention relates to a cartridge for game machine. More particularly, the present invention relates to a cartridge for game machine to be fitted in a home video game machine used as being connected to a television receiver or a CRT display, or a portable game machine with a small display or the like, and being detachably fitted to the game machine depending on the nature of the game (game program).

2. Description of the Prior Art

A conventional cartridge for game machine comprises, for example as disclosed in Japanese Laid-open Utility Model No. 62-117650 (hereinafter prior art 1), a cartridge (10, reference numeral shown in FIG. 1, same hereinafter), a case (12), and a board (18). The board (18) includes a protrusion (20) forming contacts (22), and the protrusion (20) is exposed through an opening (16) in a protrusion (14) of the case (12). At the time of use, the protrusion (20) is inserted into an edge connector (32) of a game machine main body (30), and each contact (22) is connected electrically to the circuit of the game machine (30).

In a state out of use not fitted in the game machine, a constitution for covering the contact area of the cartridge board is disclosed in Japanese Laid-open Patent No. 53-26611 (prior art 2). The cartridge (28, reference numeral shown in FIG. 4, same hereinafter) disclosed in prior art 2 comprises external housings (60, 62) accommodating a printed circuit board (66) and a door assembly (64). The door assembly (64) is composed of a single formed unit containing a lid (65), a pivot (84) and an L-member (86), and usually the lid (65) is deviated in a closed position by a spring (92).

When the cartridge (28) is inserted into an opening (26) of the game machine console (10), a leg (90) of the L-member (86) is engaged with a tab (119) and rotated, and the lid (65) is opened. When the cartridge (28) is further inserted, the board (66) advances into the game machine (10) side door assembly (110), and a contact ribbon (80) and a contact member (160) are electrically connected.

In the prior art 1, since the contacts (22) are exposed outside, the user may possibly touch the contacts (22) by hand or dust or dirt may deposit, and rusting is likely to be caused by fingerprints or dust, which may lead to faulty contact or malfunction.

In the prior art 2, although the cartridge board is not exposed, it is always thrust only with a spring, and there is no particular means for keep in closed state and it can be easily opened by hand, and hence the problems of the prior art 1 are not solved. Moreover, it requires many members and the structure is complicated, and assembling is difficult. Containing movable parts, trouble and breakage are likely to occur when detaching and attaching are repeated frequently.

SUMMARY OF THE INVENTION

Therefore, a principal object of the invention is to provide a novel cartridge for game machine.

Another object of the invention is to provide a cartridge for game machine capable of preventing the faulty contact or malfunction.

Another object of the invention is to provide a cartridge for game machine capable of preventing the trouble and breakage with simple structure.

A cartridge for game machine according to the invention is a cartridge for game machine detachably constituted for a game machine to be used by displaying pictures in video display means, including a male connector having a plurality of terminal pins projected and arranged at least in one row, comprising a housing, a female connector, and a board. The housing is a flat form consisting of a front half and a rear half formed of insulating material. The female connector is formed of insulating material and held with a part exposed from one side of the housing. The board is contained in a space enclosed by the housing and female connector, and forms a desired conductive circuit pattern formed at least on a principal surface. On the board, memory means storing game data inside is connected to the conductive circuit pattern, and a plurality of distribution electrodes formed along a side confronting the female connector are connected to the conductive circuit pattern. The female connector comprises a plurality of terminal holes opened corresponding to the plurality of terminal pins, and a plurality of connection terminals to be connected to the plurality of distribution electrodes in a state being fitted in the plurality of terminal holes.

The plurality of terminal pins contained in the female connector are electrically connected to the plurality of distribution electrodes formed on the board through the plurality of connection terminals, and thereby the plurality of distribution electrodes are directly connected to the female connector without being exposed outside.

According to the invention, since the plurality of distribution electrodes formed on the board are not exposed from the housing of the cartridge, the user may not touch the board or the terminals formed on the board directly by hand, and trouble and malfunction can be prevented.

In an aspect of the invention, the portion exposed outside of the plurality of terminal holes is formed in a funnel form, and accordingly, if the central axis of the insertion direction of the terminal pins is slightly deviated from the central axis of the terminal holes, the insertion direction of the terminal pins is corrected in the funnel formed portion, and hence the terminal pins are prevented from being folded without being inserted into the insertion holes.

In another aspect of the invention, since the plurality of connection terminals to be fitted in the plurality of terminal holes are formed by folding a conductive member into a nearly cylindrical form, so that the inside diameter may be increased gradually toward the inward direction of the cartridge, if dust or foreign matter invade in the terminal holes, it is pushed out in the inward direction of the housing by collaboration with the terminal pins at the game machine side, so that clogging due to dust or foreign matter may be prevented.

In the other aspect of the invention, since the contact piece is elastically thrust in the central direction of the terminal holes, electric connection is achieved securely if the outside diameter of the terminal pins is smaller than the inside diameter of the terminal holes. If terminal pins are inserted, moreover, there is still a gap in the terminal holes, and clogging does not occur if dust or foreign matter invade into the terminal holes.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
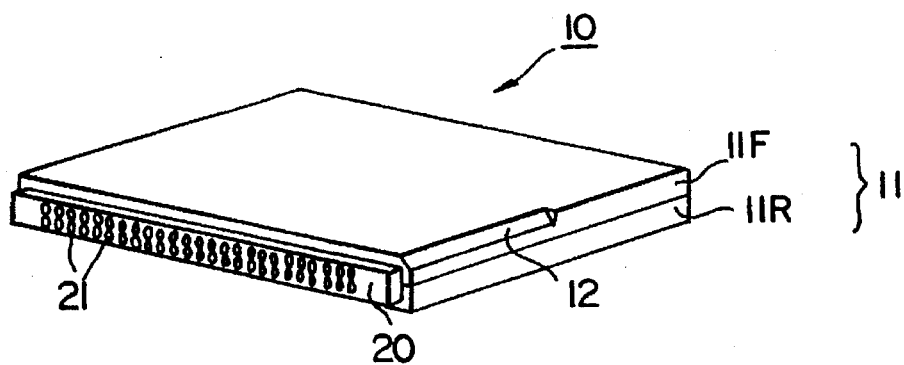
FIG. 1 is a perspective view of a cartridge for game machine in an embodiment of the invention.
Figure 2:
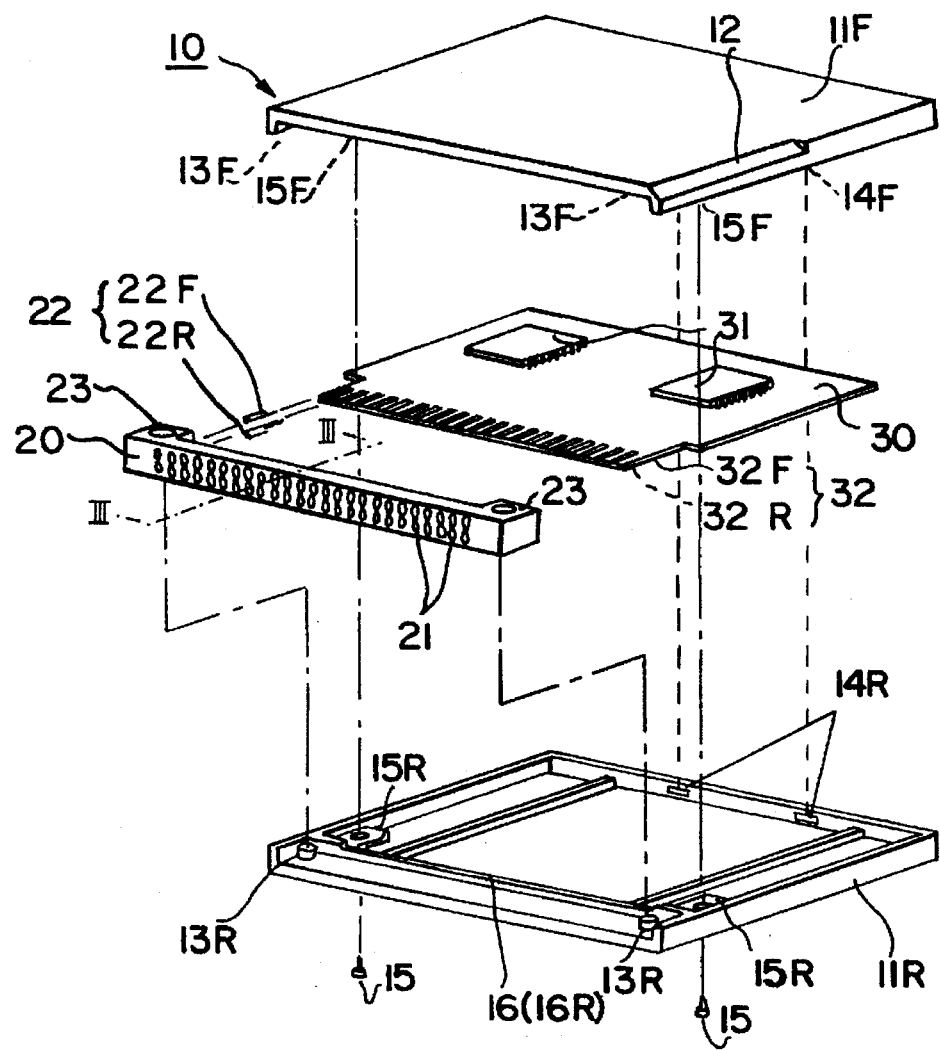
FIG. 2 is an exploded perspective view of the embodiment in FIG. 1.

FIG. 1 and FIG. 2 are diagrams showing an embodiment of a cartridge for game machine of the invention, and specifically FIG. 1 is a perspective view as seen from the surface side, and FIG. 2 is an exploded perspective view of the embodiment in FIG. 1.

In FIG. 1, a cartridge for game machine (hereinafter called cartridge) 10 comprises a flat housing 11 and a connector 20, and the housing 11 consists of a front half 11F and a rear half 11R formed of synthetic resin material such as plastics. A slope 12 is formed in the front half 11F, which prevents the cartridge 10 from being inserted upside down in the game machine, in collaboration with the cartridge inlet of the game machine formed in a shape so that the cartridge 10 can be inserted. The connector 20 is formed of synthetic resin material same as the housing 11, and a plurality of terminal holes 21 are formed in two rows in the longitudinal direction thereof. In the embodiment in FIG. 1, the connector 20 is put in the housing 11 with its part projected therefrom.

As shown in FIG. 2, a board 30 is put in the housing 11. On the board 30, semiconductor devices 31 such as read only memory (ROM) and random access memory (RAM) are mounted by proper means such as surface mounting. These semiconductor devices 31 are electrically connected with a desired conductive pattern (not shown) formed on the board, and the conductive circuit pattern is drawn out to the end portion of the substrate 30, and forms a plurality of distribution electrodes 32. The distribution electrodes 32 include front electrodes 32F formed on the front side, and rear electrodes 32R (not shown) formed on the rear side of the board 30.

In the terminal holes 21 of the connector 20, a plurality of connection terminals 22F and 22R to be connected to the front electrodes 32F and rear electrodes 32R are fitted. At both ends of the connector 20 in the longitudinal direction, engaging holes 23 to be engaged with protrusions 13F (not shown), 13R formed on the front half 11F and rear half 11R are formed.

In assembling, first the connection terminals 22 are fitted into terminal holes 21 of the connector Next, tongues 25 of the connection terminals 22 and distribution electrodes 32 are electrically connected by proper means such as flow solder, and the board 30 are fixed to the connector 20. Herein, the semiconductor devices 31 are preliminarily mounted on the board 30.

After positioning the protrusions 13R and engaging holes 23, the connector 20 and board 30 are mounted on the rear half 11R. The front half 11F causes the engaging pawls 14F (not shown) to engage with the engaging holes 14R of the rear half 11R, and positions and inserts the protrusions 13F (not shown) into the engaging holes 23 of the connector 20. Finally, screws 15 are inserted from the rear half 11R, and the front half 11F and rear half 11R are fastened together.

Figure 3:
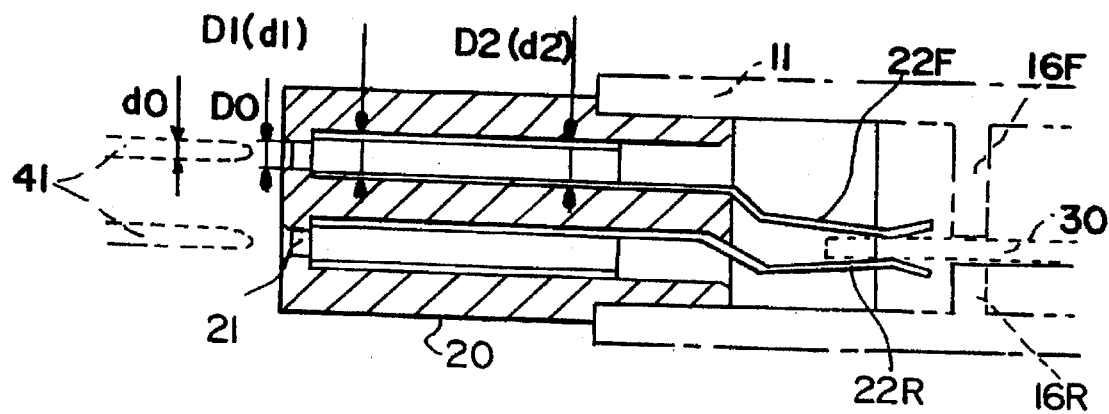
FIG. 3 is a sectional view of a connector contained in the cartridge for game machine of the invention along line III—III in FIG. 2.
Figure 8:
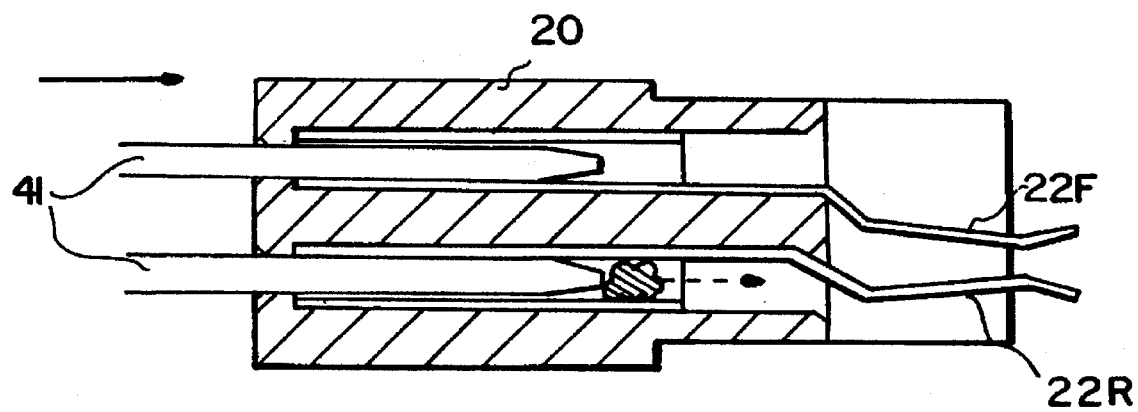
FIG. 8 is a magnified sectional view showing,the state of dust invading inside the terminal holes, being pushed away by the terminal pins and discharged to the inner side in the insertion direction of terminal pins.

FIG. 3 is a sectional view of the connector 20 along line III—III in FIG. 2. As shown in FIG. 3, the connection terminals 22F and 22R are inserted from the right direction of the terminal holes 21 in FIG. 3. The terminal holes 21 are formed so that the inside diameter D2 near the rear end of the connector 20 may be gradually larger than the inside diameter D1 near the front end. The inside diameter D0 of the front end portion of the terminal holes 21 is slightly larger than the outside diameter d0 of terminal pins 41 (see FIG. 3 or FIG. 5) of a male connector 40 (see FIG. 8) of the game machine side, and smaller than the inside diameter D1, and a step is formed in the boundary area so that the connecting terminals 22 may be fitted thereto.

The outside diameter of the connection terminals 22 is formed so that the outside diameter d2 near the rear end may be gradually larger than the outside diameter d1 near the front end. Accordingly, if dust or foreign matter invades into the terminal holes 21 (connection terminals 22), the foreign matter may be pushed out in the inward direction of the cartridge 10 by insertion of terminal pins 41, thereby preventing the terminal holes 21 from being clogged with dust or foreign matter (see FIG. 8).

Figure 4:
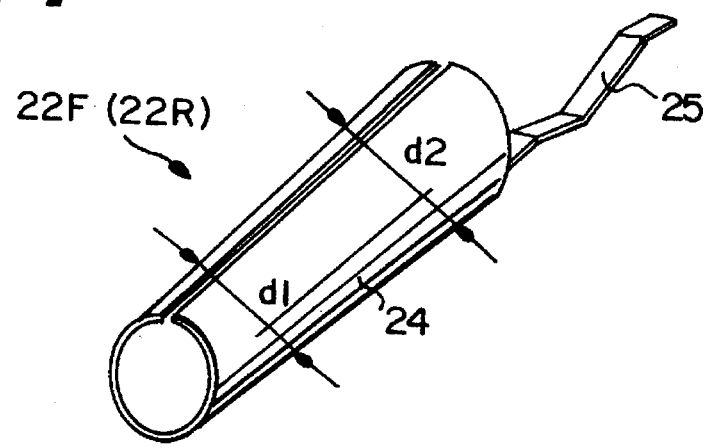
FIG. 4 is a magnified perspective view of connection terminals contained in the connector of the cartridge for game machine of the invention.
Figure 5:
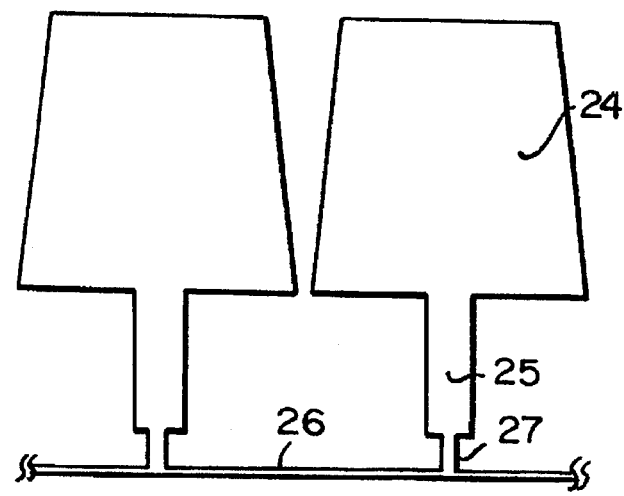
FIG. 5 is a reference drawing showing the state before folding of connection terminals shown in FIG. 4.

FIG. 4 is a magnified perspective view of connection terminal 22F (22R). As shown in FIG. 4, the connection terminal 22F or 22R is formed integrally with the connection portion 24 and tongue 25 from a conductive material (FIG. 5). The connection portion 24 is formed nearly in a cylindrical form by folding a metal or the like, and is connected electrically to the terminal pins 41 when the terminal pins 41 of the game machine are inserted. The tongues 25 are electrically affixed to the distribution electrodes 32 of the board 30 by soldering or the like. In the embodiment in FIG. 1, the board 30 is disposed and stored at the rear half 11R side. Accordingly, the tongues 25 of the connection terminals 22F and 22R are folded slightly differently, and hence excess stress is not applied to the tongues when soldering the tongues 25 to the board 30.

FIG. 5 is a reference diagram showing the state of blanking the connection terminals 22F and 22R by metal press or the like. Initially after blanking, the connection terminal 22 are linked as a series of parts by couplings 26 and 27. In this state, advancing to next step (folding of connection portion 24), a plurality ofity is fitted into the terminal holes 21 together in linked state. After the folding step, separating from the couplings 26 and 27, each piece is then manually fitted into the terminal holes 21.

Figure 6:
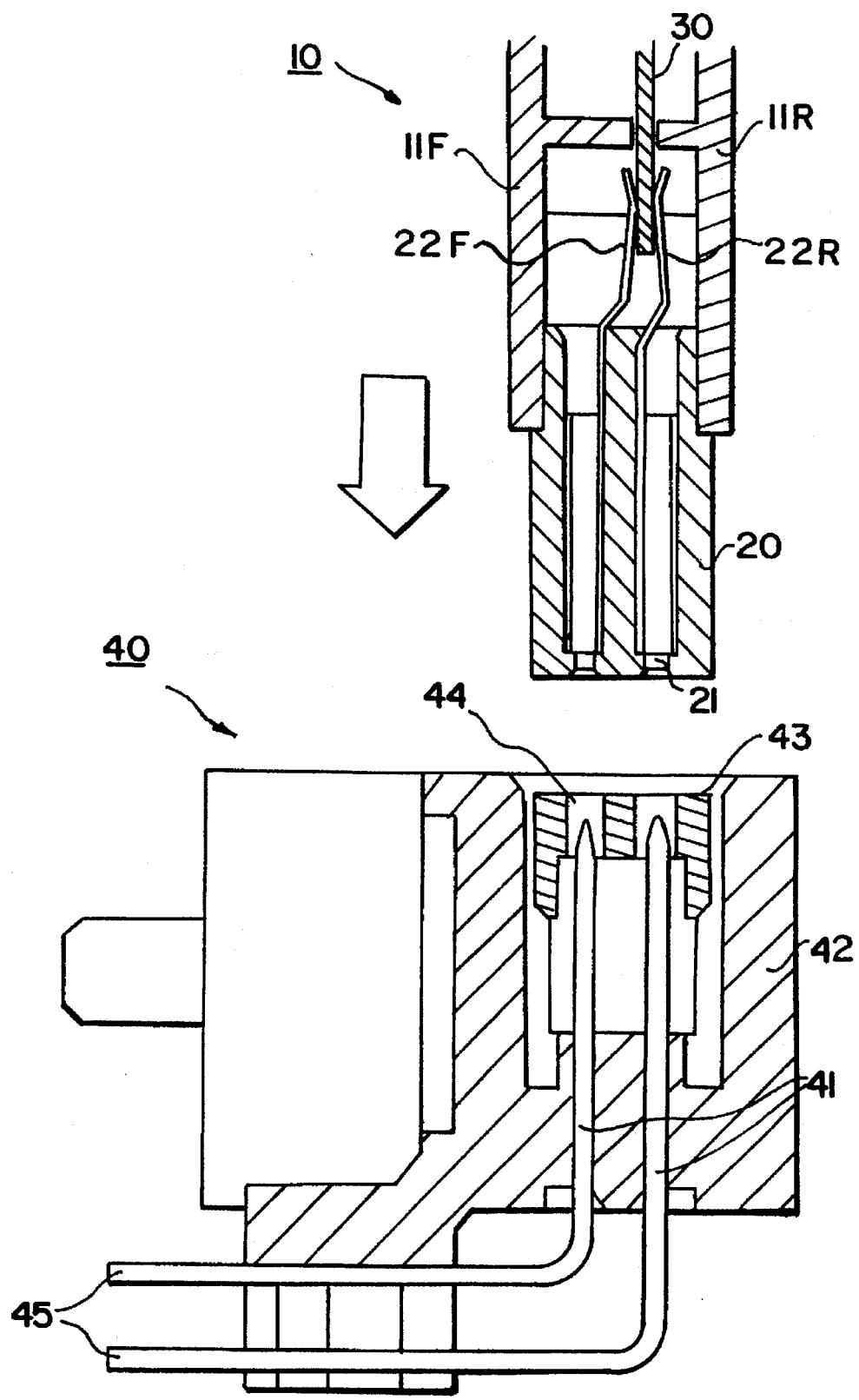
FIG. 6 shows an example of connector at game a machine side in which the cartridge for game machine of the invention is fitted, and is a sectional view of the state of the connector in the embodiment in FIG. 1 fitted into the game side connector.

FIG. 6 shows an example of game machine side connector 40 in which the cartridge for game machine of the invention is fitted, and is a sectional view showing the fitting state of the cartridge side connector 20 of the invention in the game machine side connector 40. The connector 40 comprises terminal pins 41 inserted into the connector 20 of the cartridge 10, a body 42 for holding the terminal pins 41, and a cover 43 oscillatable vertically in the body 42. The cover 43 has holes 44 formed in the same number and same array as the terminal pins 41 (that is, in the same number and same array as the terminal holes 21 of the connector 20), and it is usually thrust upward by a spring or the like (not shown) with the front ends of the terminal pins 41 inserted in the holes 44.

When fitting the cartridge 10 into connector 40, first the front end surface of the connector 20 abuts against the upper surface of the cover 43. Then the cover 43 is pushed down by the connector 20, and simultaneously terminal pins 41 penetrate through the holes 44 to project upward, and the cover 43 is pushed down further, so that the terminal pins 41 is inserted into the terminal holes 21 of the connectors 20. In the connector 40, by means of the cover 43, deposit of dust or foreign matter on the terminal pins 41 is prevented, and if dust may invade near the connector, it can be discharged by the cover 43. Moreover, since the holes 44 are formed in the same number and same array as the terminal pins 41, if the terminal pins 41 are slightly bent, their ends are always positioned in the holes 44, and are hence guided by the holes 44 to be inserted accurately into the terminal holes 21 of the connector 20.

Figure 7:
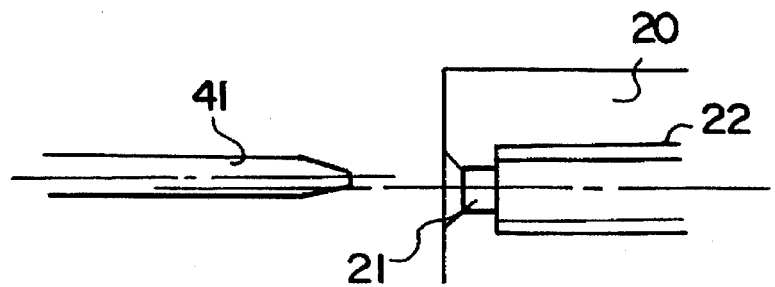
FIG. 7 is a magnified sectional view showing the state of insertion of terminal pins deviated in axis into the terminal holes.

Or, as shown in FIG. 7, if the insertion direction central axis of the terminal pins 41 is deviated from the central axis of the terminal holes 21, the front ends of the terminal pins 41 are guided by the funnel-shaped taper formed in the front end portion of the terminal holes 21, and the insertion direction into the terminal holes 21 is corrected, and the terminal pins 41 are accurately inserted into the terminal holes 21.

Figure 9:
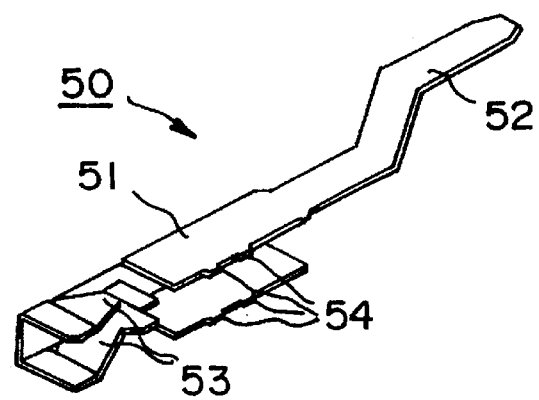
FIG. 9 is a perspective view showing a modified example of connection terminals contained in the connector of the invention.
Figure 10:
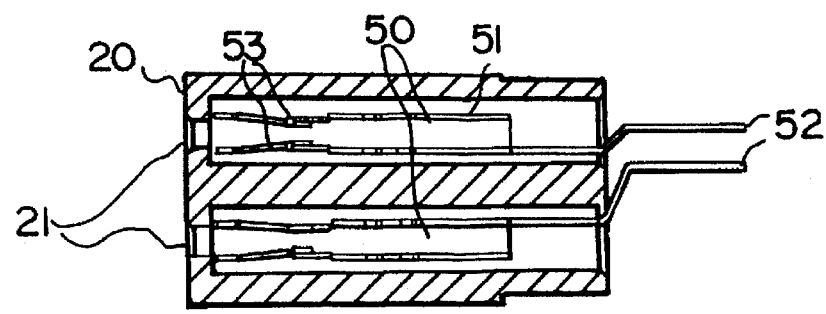
FIG. 10 is a vertical sectional view of a connector in which connection terminals shown in FIG. 9 are fitted.
Figure 11:
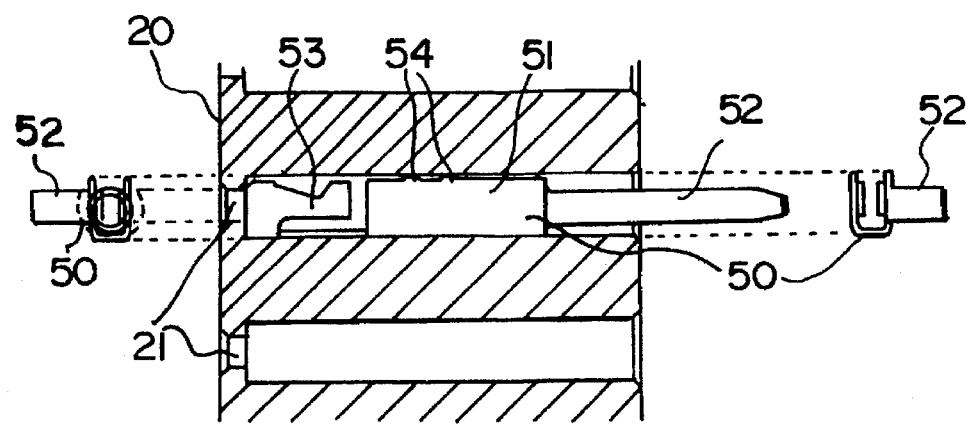
FIG. 11 is a horizontal sectional view of a connector in which connection terminals shown in FIG. 9 are fitted.

FIG. 9 to FIG. 11 relate to a modified embodiment of connection terminals used in the female connector of the cartridge for game machine of the invention, and specifically FIG. 9 is a perspective view of a connection terminal 50, FIG. 10 is a vertical sectional view (in the same direction as in FIG. 3) of the connector 20 in which the connection terminals 50 are inserted, and FIG. 11 is a horizontal sectional view of the connector 20 in which the connection terminals 50 are inserted. In FIG. 9, the connection terminal 50 is composed of a base 51 and a tongue 52. The base 51 is formed in a U-letter-section by folding a conductive material. The tongue 52 is formed by slightly varying the folding manner so as to correspond to front distribution electrode 32F and rear distribution electrode 32R. On the confronting side of the base 51, elastic pieces 53 being thrust to each other elastically in the central direction, and protrusions 54 to be engaged when the connection terminals 50 are fitted into terminal holes 21 are fitted are formed in a plurality ofity.

Referring now to FIG. 10 and FIG. 11, when the connection terminals 50 are inserted into insertion holes 21, the protrusions 54 are hooked inside the terminal holes 21 and fitted. A gap formed between a pair of elastic pieces 53 is set smaller than the outside diameter of the terminal pins 41, and opens elastically when the terminal pins 41 are inserted to securely contact electrically with the terminal pins 41. Meanwhile, the elastic pieces 53 are not always required in a pair, but if folded so as to open elastically when the terminal pins 41 are inserted, at least one elastic piece 53 may be formed at either position of the base 51.

Besides, by constituting so as to open at the insertion direction front side of the pins 41 as in the elastic piece 53 of the connection terminal 50 in the embodiment in FIG. 9, if dust or foreign matter invades, by inserting the terminal pins 41, it may be pushed away into the deeper side in the insertion direction of the terminal pins 41, and it is further prevented from being pushed back in the reverse direction (that is, in the front direction of the connector 20), so that clogging will not occur.

Figure 12:
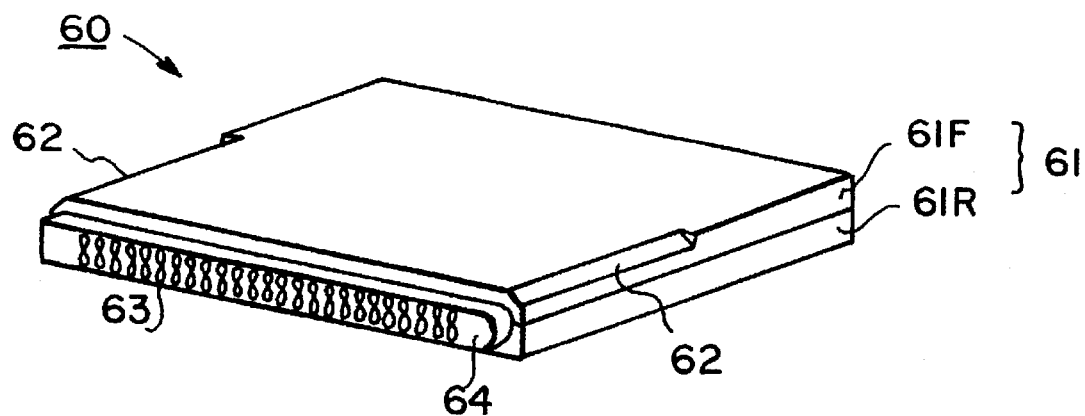
FIG. 12 is a perspective view showing other embodiment of a cartridge for game machine of the invention.
Figure 13:
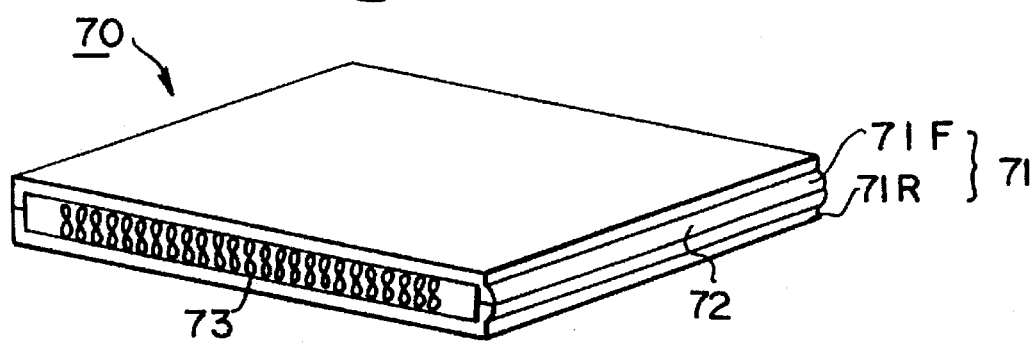
FIG. 13 is a perspective view showing another embodiment of a cartridge for game machine of the invention.
Figure 14:
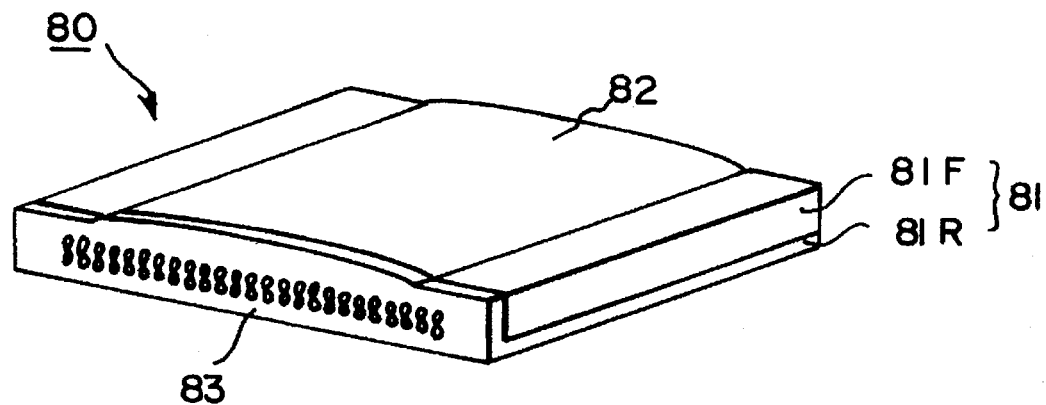
FIG. 14 is a perspective view showing a different embodiment of a cartridge for game machine of the invention.

FIG. 12 to FIG. 14 relate to different embodiments of the cartridge for game machine of the invention. The basic constitution is same as in the embodiment in FIG. 1, and only the different points from the features of the foregoing embodiments are described below.

In a cartridge 60 in FIG. 12, tapered reverse side insertion preventive means 62 are formed at both ends of the connector 63 side on the surface of a housing 61. By varying the shape of the connector at both ends in the longitudinal direction, reverse side insertion preventive means 64 is also provided in the connector 63.

A cartridge 70 in the embodiment in FIG. 13 forms protrusions of reverse side insertion preventive means 72 over the entire one side of a housing 71. A connector 73 is put in the housing 71 so as not project outward.

A cartridge 80 in the embodiment in FIG. 14 is composed of a front half 81F and a rear half 81R, and a connector 82 is formed integrally with the rear half 81R. The thickness of the front middle area of the front half 81F is swollen so as to be larger than the overall thickness, the shape of the sides of the cartridge 80 is different, thereby preventing from being inserted upside down in the connector of the game machine side.

In all cartridges 80, 70 and 80 in the embodiments in FIG. 12 to FIG. 14, same as in the embodiment in FIG. 1, housing and connector made of synthetic resin such as plastics are used, and the shape of the connection terminals may be either as shown in FIG. 4 or as shown in FIG. 9. To correspond to the cartridge shape of each embodiment, the game machine side connector and cartridge inlet of the game machine side are formed.

In FIG. 12 to FIG. 14, various modified examples of the invention are shown, but by forming the connector, as far as it is constituted so that the board may not be exposed from the housing, it does not matter however the reverse side insertion preventive means may be formed or however the configuration of the housing and connector may be.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cartridge for game machine, being a cartridge for game machine detachably constituted for a game machine to be used by displaying pictures in video display means, including a male connector having a plurality of terminal pins projected and arranged at least in one row, comprising:

a flat housing consisting of a front half and a rear half formed of insulating material, a female connector formed of insulating material and held with a part exposed from one side of the housing, and a board contained in a space enclosed by the housing and female connector, and forming a desired conductive circuit pattern formed at least on a principal surface, wherein the board comprises:

memory means connected to the conductive circuit pattern for storing game data inside, and a plurality of distribution electrodes formed along a side confronting the female connector and connected to the conductive circuit pattern, and the female connector comprises:

a plurality of terminal holes opened corresponding to the plurality of terminal pins, and a plurality of connection terminals to be connected to the plurality of distribution electrodes in a state being fitted in the plurality of terminal holes, wherein the plurality of terminal pins are electrically connected to the plurality of distribution electrodes through the plurality of connection terminals, thereby preventing the plurality of distribution electrodes from being exposed outside.

2. A cartridge for game machine of claim 1, wherein the inside diameter near the portion exposed outside of the plurality of terminal holes is slightly larger than the outside diameter of the plurality of terminal pins, and slightly smaller than the inside diameter of the plurality of terminal holes.

3. A cartridge for game machine of claim 2, wherein the portion exposed outside of the plurality of terminal holes is formed in a funnel form.

4. A cartridge for game machine of claim 1, 20 wherein the plurality of terminal holes are formed so that the inside diameter is gradually increased toward the inside direction of the cartridge.

5. A cartridge for game machine of claim 4, wherein the portion of the plurality of connection terminals fitted into the plurality of terminal holes is formed nearly in a cylindrical form by folding a conductive material, and its inside diameter is formed so as to increase gradually toward the inner direction of the cartridge.

6. A cartridge for game machine of claim 1, wherein the portion of the plurality of connection terminals fitted into the plurality of terminal holes is formed in a U-letter-section by folding a conductive material, and an elastic contact piece deviating in the central direction of the terminal holes is formed at least on one side thereof.

7. A cartridge for game machine of claim 1, wherein the female connector is formed integrally either one of the front half and rear half.

8. A cartridge for game machine of claim 1, wherein the housing forms reverse insertion preventive means for preventing from being inserted upside down in a cartridge receiving section formed in the game machine.

9. A cartridge for game machine of claim 1, wherein the female connector forms reverse insertion preventive means for preventing from being inserted upside down in the male connector of the game machine.

* * * * *